United States Patent
März et al.

[11] Patent Number: 6,057,077
[45] Date of Patent: May 2, 2000

[54] METHOD FOR PRODUCING A POSITIVE OR NEGATIVE COLOR-PROOF USING THE SAME MATERIALS

[75] Inventors: Karin März, Gross-Gerau; Dieter Mohr, Appenheim, both of Germany

[73] Assignee: Agfa-Gevaert N.V., Mortsel, Belgium

[21] Appl. No.: 09/104,366

[22] Filed: Jun. 25, 1998

[30] Foreign Application Priority Data

Jun. 26, 1997 [EP] European Pat. Off. .............. 97201961

[51] Int. Cl.⁷ .............................. G03F 7/34; G03F 7/36; G03F 7/38

[52] U.S. Cl. .......................... 430/253; 430/291; 430/292; 430/293

[58] Field of Search .................... 430/253, 291, 430/293, 292

[56] References Cited

U.S. PATENT DOCUMENTS

| | | | |
|---|---|---|---|
| 3,642,474 | 2/1972 | Verelst et al. | 96/30 |
| 3,649,268 | 3/1972 | Chu et al. | 96/27 R |
| 3,987,037 | 10/1976 | Bonham et al. | 260/240 D |
| 4,081,282 | 3/1978 | Merrill et al. | 96/77 |
| 4,260,673 | 4/1981 | Krech | 430/143 |
| 4,288,525 | 9/1981 | Shepherd et al. | 430/253 |
| 4,347,300 | 8/1982 | Shimazu et al. | 430/156 |
| 4,650,738 | 3/1987 | Platzer et al. | 430/143 |
| 4,656,114 | 4/1987 | Cederberg et al. | 430/160 |
| 4,659,642 | 4/1987 | Platzer et al. | 430/143 |
| 4,895,787 | 1/1990 | Platzer | 430/253 |
| 4,963,462 | 10/1990 | Wilczak | 430/253 |
| 5,049,476 | 9/1991 | Platzer | 430/253 |
| 5,126,226 | 6/1992 | Fröhlich et al. | 430/257 |
| 5,217,840 | 6/1993 | Spak et al. | 430/165 |
| 5,294,515 | 3/1994 | Wilczak et al. | 430/253 |
| 5,372,910 | 12/1994 | Metzger et al. | 430/202 |
| 5,792,588 | 8/1998 | Wilczak et al. | 430/253 |

FOREIGN PATENT DOCUMENTS

| | | |
|---|---|---|
| 0 255 032 | 7/1987 | European Pat. Off. . |
| 0 365 354 | 10/1989 | European Pat. Off. . |
| 0 365 361 | 10/1989 | European Pat. Off. . |

OTHER PUBLICATIONS

Ricoh, Light– and heat–sensative recording element–comprises visible light–sensitive layer and UV ray–sensitive layer on support, European Abstract (AN) #81–22356D, Class E19, Feb. 2, 1981.

*Primary Examiner*—Richard L. Schilling
*Attorney, Agent, or Firm*—Foley & Lardner

[57] ABSTRACT

The invention relates to a process for the production of a colored image for color proofing of copy masters for multicolor printing and a layer material for carrying out this process.

A positive image of the exposure mask (color separation film) is produced by lamination of a photosensitive material onto a colored layer material, followed by imagewise exposure and peeling-off of a film support, or a negative image of the exposure mask is obtained by imagewise exposure of the photosensitive material before the lamination, accompanied by flood exposure after lamination followed by peeling-off of a film support. The two procedures use the same materials and do not require wet development. For each single-color image, only one lamination step is required.

15 Claims, 2 Drawing Sheets

```
Structure of the novel
material before lamination
```

1a    Photosensitive film

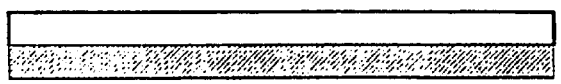

1 Support of the photosensitive film
2 Photosensitive layer

1b    Coloured film

3 Support of the coloured film
4 Coloured layer
5 Adhesive layer

6 Image-receiving material

Fig. 1  Structure of the novel
        material before lamination

1a      Photosensitive film

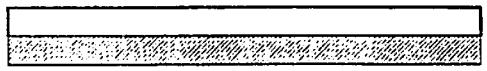

1 Support of the photosensitive film
2 Photosensitive layer

1b      Coloured film

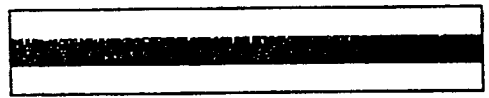

3 Support of the coloured film
4 Coloured layer
5 Adhesive layer

6 Image-receiving material

Fig. 2  Positive process: Structure of
        the coloured image after lami-
2a      nation of the 1st single colour

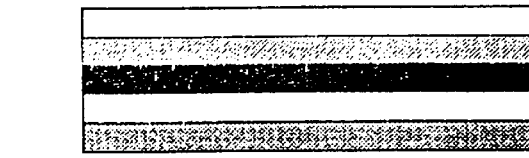

1 Support of the photosensitive film
2 Photosensitive layer
4 Coloured layer
5 Adhesive layer
6 Image-receiving material 2b      After development of the 1st
        single colour

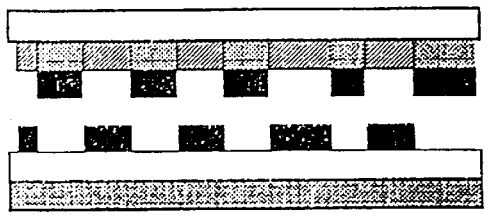

1  Support of the photosensitive film
2* Imagewise-exposed photosensitive
   layer
4* Coloured layer
4  Coloured layer
5  Adhesive layer
6  Image-receiving material unexposed photosensitive layer
exposed photosensitive layer Fig.3   Negative process 3a      Exposure of the photosensitive
        film

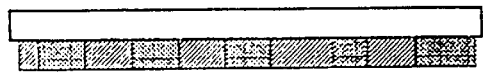

1  Support of the photosensitive film
2* Imagewise-exposed   photosensitive
   layer 3b  Structure of the material after lamination

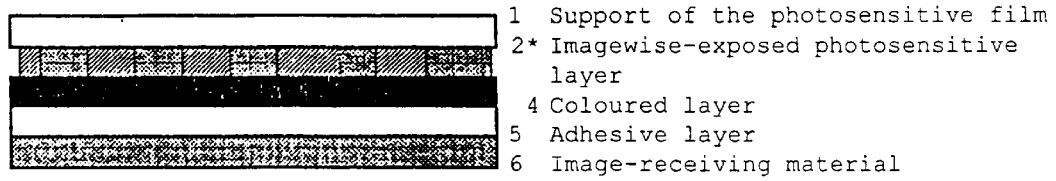

1  Support of the photosensitive film
2* Imagewise-exposed photosensitive layer
4  Coloured layer
5  Adhesive layer
6  Image-receiving material 3c  After flood exposure and development of the 1st single colour

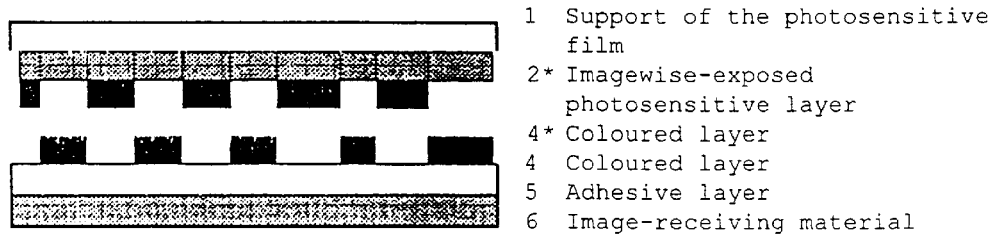

1  Support of the photosensitive film
2* Imagewise-exposed photosensitive layer
4* Coloured layer
4  Coloured layer
5  Adhesive layer
6  Image-receiving material

METHOD FOR PRODUCING A POSITIVE OR NEGATIVE COLOR-PROOF USING THE SAME MATERIALS

FIELD OF THE INVENTION

The invention relates to a process for the production of a colour image for colour proofing of copy masters for multicolour printing, and to a layer material for carrying out this process.

PRIOR ART

A colour image of this type is generally made in order to enable checking and, if necessary, correction of the colour separations intended for exposure of the printing plates in multicolour printing. The colour separations can be intended for a positive process or for a negative process.

When making a colour proof, it is usual to generate single-colour images corresponding to the primary colours of multicolour printing in succession on an image-receiving material or to transfer these images to an image-receiving material.

Each single-colour image is produced by exposing and developing a photosensitive layer, the development taking place either by washing or by peeling-off a film support. Numerous materials and processes for making such colour proofs are known and are described, for example, in the following specifications: U.S. Pat. No. 3,649,268, U.S. Pat. No. 3,642,474, U.S. Pat. No. 4,260,673, U.S. Pat. No. 4,650,738, U.S. Pat. No. 4,656,114, U.S. Pat. No. 4,659,642, U.S. Pat. No. 4,895,787, U.S. Pat. No. 5,049,476, EP-A 352 055, EP-A 525 624 and EP 603 642. The materials described in these specifications for making colour proofs consist of a plurality of layers on temporary film supports. The processes described give, depending on the composition of the material and the procedure, either a positive or negative copy of the colour separation film. These specifications do not describe any processes in which both positive and negative images can be obtained from the identical starting material.

In processes which involve wet development, methods for producing negative images from a positive-working material are known. Image reversal of this type can be achieved by post-warming followed by flood exposure and wet development (for example U.S. Pat. No. 5,217,840). In a wet development-free system, which is preferred for ecological and economic reasons, such a procedure is not possible.

U.S. Pat. No. 5,294,515 describes a wet development-free process which enables a negative image to be obtained using a single material. The material described therein consists of a film support having a release surface, a photosensitive layer on said release surface, which photosensitive layer is simultaneously coloured in one of the primary colours of multicolour printing, and a thermoplastic adhesive layer. This layer material is laminated, by means of the adhesive layer, onto an image-receiving material. After this lamination, the photosensitive coloured layer is exposed imagewise under the corresponding colour separation film; the film support is then peeled off. Since the film support has a release surface, both the unexposed and the exposed areas of the coloured layer remain on the image-receiving material together with the entire adhesive layer. In a second lamination, the imagewise-exposed coloured layer is then laminated with another transparent film support which differs from the original film support in that an adhesion promoter is present on the surface. This film support is laminated, by means of the side pretreated with adhesion promoter, onto the imagewise-exposed coloured layer. This 2nd lamination is followed by flood exposure. The film support is peeled off; together with the film support, the parts of the coloured layer which are not exposed in the first imagewise exposure, then later exposed in the flood exposure, are peeled off, while the parts exposed during the first imagewise exposure remain on the adhesive layer and the image-receiving material, and so represent a negative copy of the exposure master.

The disadvantages of this process compared with the invention described here are the double lamination (additional processing step) and the use of two different transparent film supports (additional use of material). Since dust inclusions can occur in each lamination, double lamination also impairs the image quality.

SUMMARY OF THE INVENTION

The present invention describes a process in which a positive copy of the exposure mask (colour separation film) is obtained by lamination of a photosensitive material onto a coloured layer material, followed by imagewise exposure and peeling-off of a film support, or a negative copy of the exposure mask is obtained by imagewise exposure of the photosensitive material before lamination, accompanied by flood exposure after lamination followed by peeling-off of a film support. Both procedures use the same materials and do not require wet development. The special feature of the novel material is separation of the photosensitive layer and the coloured layer. This type of separation of the two layers is also described in EP-A 620 499. The advantage of such a separation is stated therein as being the ability to use coloured photosensitive compounds, which allow a greater spectral range for the exposure. However, the process described therein gives exclusively positive images (p. 5, lines 50–51).

DETAILED DESCRIPTION OF THE INVENTION

1.) Photosensitive Film Support (see FIG. 1a)

A photosensitive compound is applied to a dimensionally stable, transparent and flexible film support (for example biaxially stretched polyethylene terephthalate, thickness 50 $\mu$m) which may additionally have been pretreated with an adhesion promoter on one or both sides. Application from solution is preferred. Preferred photosensitive compounds are s-triazines, hexaarylbisimidazoles and quinoxalines, but acridines, phenazines, metallocenes, benzophenones, acetophenones, benzoins and benzils are also suitable. Particular preference is given to bistrichloromethyl-s-triazines, as described, for example, in U.S. Pat. No. 3,987,037 and EP 556 731. Since the photosensitive layer is separated from the coloured layer, it is also possible to use intensely coloured photosensitive compounds. In contrast to the teaching of U.S. Pat. No. 5,294,515, in which initiators having the lowest possible effect on the layer colour are necessary, the novel process allows the use of a broad range of photoinitiators and thus control of the sensitivity of the material over a broad spectral region. In addition, it also allows the use of intensely coloured sensitizer dyes, which sensitize the material for exposure in the visible region. The maximum layer thickness is preferably 1 $\mu$m.

2.) Coloured Film (see FIG. 1b)

A layer containing at least one coloured pigment or a dye in a primary colour of multicolour printing, a free-radical-polymerizable, ethylenically unsaturated compound and a binder is applied to a dimensionally stable, flexible film support (for example biaxially stretched polyethylene terephthalate). If a coloured pigment is used, this is dispersed in some of the binder before its addition. Examples of suitable binders are acrylate polymers and copolymers, cellulose derivatives, phenolic resins and polyvinyl esters. Preferred binders are polyvinyl acetals.

The polymerizable compound preferably contains at least two free-radical-polymerizable double bonds and is not gaseous at temperatures below 100° C. and at atmospheric pressure. Preference is given to esters and amides of acrylic and methacrylic acid with polyhydric alcohols.

The colorants are selected so that they correspond to the primary colours of multicolour printing (cyan, magenta, yellow and black). Pigments are preferred over dyes. Suitable pigments are described, for example, in EP 556 731. The layer weight of the coloured layer is preferably 0.3–3 g/m². The layer thickness should be selected for each colour so that the standard colour densities of multicolour printing are achieved in the finished image. A further layer—the adhesive layer—is applied to this layer. This adhesive layer consists of at least one thermoplastic binder. The softening point of the adhesive layer should be in the range 40–200° C., preferably between 60 and 120° C. Examples of adhesive layers are described in EP 603 642. The layer weight of the adhesive layer is preferably 2–10 g/m².

The two layers are preferably applied from solution, but can also be laminated onto one another. In the case of application from solution, a solvent which does not attack the coloured layer is preferably selected for the adhesive layer.

All the layers described may, if desired, contain further constituents, such as, for example, plasticizers, optical brighteners, inert fillers or surface improvers.

The laminations are carried out under pressure and at a temperature of about 60–130° C.

3.) Image-Receiving Material (FIG. 1c)

The image-receiving material can be any material which is dimensionally stable under the lamination conditions. Preference is given to plastic-coated paper.

4.) Production of a Positive Single-Colour Image (see FIG. 2)

The coloured film described under 2.) (FIG. 1b) is laminated, by means of the adhesive layer (5), onto the image-receiving material (6). After the lamination, the film support (3) is peeled off. The adhesive layer and the entire coloured layer remain on the image-receiving material. The photosensitive film described under 1.) (FIG. 1a) is laminated, by means of the photosensitive layer (2), onto the coloured layer. The resultant laminate has the structure shown in FIG. 2a. This layer material is exposed imagewise using actinic light through the film support (1) in contact under a positive mask (colour separation film). After the exposure, the film support (1) is peeled off. Together with the film support, the photosensitive layer (2) and the parts of the coloured layer (4*) which adhere in the exposed areas are peeled off. The adhesive layer and the parts of the coloured layer (4) which do not adhere to the unexposed areas of the photosensitive layer remain on the image-receiving material (see FIG. 2b). In this way, a positive image of the exposure mask is obtained on the image-receiving material.

5.) Production of a Negative Single-Colour Image (see FIG. 3)

The coloured film described under 2.) (FIG. 1b) is laminated, by means of the adhesive layer (5), onto the image-receiving material (6). After the lamination, the film support (3) is peeled off. The adhesive layer and the entire coloured layer remain on the image-receiving material.

The photosensitive film described under 1.) (FIG. 1a) is exposed imagewise using actinic light through the film support (1) under a negative exposure mask (colour separation film) (FIG. 3a) and is then laminated, by means of the photosensitive layer (2), onto the coloured layer (4). The resultant laminate has the structure shown in FIG. 3b. This layer material is then flood-exposed using actinic light through the film support (1). After the flood exposure, the film support (1) is peeled off. Together with the film support, the photosensitive layer (2) and the parts of the coloured layer (4*) which adhere to the areas which are initially not exposed during imagewise exposure of the layer (2), but are then exposed during the flood exposure are peeled off. The adhesive layer and the parts of the coloured layer (4) which do not adhere to the areas of the photosensitive layer which had already been exposed before the lamination remain on the image-receiving material (see FIG. 3c). In this way, a negative image of the exposure mask is obtained on the image-receiving material.

The basis for image differentiation in the positive and negative procedures is an increase in the adhesive strength between the photosensitive layer (2) and the coloured layer (4) during exposure. If the photoreaction has already taken place in the photosensitive layer owing to prior exposure thereof, adhesion can no longer be produced between the coloured layer and the photosensitive layer.

After development of the first single-colour image, the second and subsequent single-colour images are produced by lamination, exposure and development or exposure, lamination, flood exposure and development, until a complete colour proof is obtained on the support.

The invention is illustrated in greater detail by the examples below.

EXAMPLE 1

Production of a Photosensitive Film According to FIG. 1a

Coating solutions having the following composition are in each case applied to a transparent polyethylene terephthalate film with a thickness of 50 μm which has been pretreated with an adhesion promoter (for example Melinex® 457 from ICI). The coatings are then dried for 2 minutes at 70° C. The layer weight of the dried coating is about 0.02–0.05 g/m². The amounts given in the table are parts by weight.

| Constituent No. | 1 | 2 | 3 | 4 |
|---|---|---|---|---|
| 2-diphenyl-(4)-4,6-bis-trichloromethyl-s-triazine | 0.05 | | | |
| 2-(4-styrylphenyl)-4,6-bis-trichloromethyl-s-triazine | | 0.02 | | |
| bis(2-chlorophenyl-4,5-diphenylimidazole) | | | 0.01 | |
| 2,3-bis-(4-methoxyphenyl)-quinoxaline | | | | 0.01 |
| tetrahydrofuran | 100 | 100 | | 100 |
| dichloromethane | | | 100 | |

EXAMPLE 2

Production of Coloured Films According to FIG. 1b

Four coloured films in the primary colours of multicolour printing (cyan, magenta, yellow and black) are produced by first applying coating solutions having the following composition in each case to a biaxially stretched, thermoset polyethylene terephthalate film with a thickness of 50 μm (for example Melinex® 456 from ICI). The coatings are then dried for 2 minutes at 70° C.

| Constituents | Cyan | Magenta | Yellow | Black |
|---|---|---|---|---|
| | | Parts by weight | | |
| 1. Hostaperm blue B2G (C.I.74160 | 7 | | | |
| 2. Permanent Yellow GR (C.I.21100) | | | 7 | |
| 3. Permanent Carmine FBB (C.I.12485 | | 12 | | |
| 4. Carbon black (Printex ®25) | | | | 11 |
| 5. Polyvinylformal (Formvar ®12/85, Monsanto) | 6 | 18 | 13 | 9 |
| 6. Dipentaerythritol pentaacrylate | 8 | 8 | 12 | 12 |
| 7. γ-Butyrolactone | 44 | 89 | 65 | 90 |
| 8. Tetrahydrofuran | 200 | 200 | 200 | 200 |
| 9. 1-Methoxy-2-propanol | 444 | 489 | 465 | 490 |

Before addition to the respective solution, the pigments 1.–4. are dispersed together with some of the binder (5.) and some of the solvent (8.) in a ball mill.

An adhesive-layer solution having the following composition is applied to the dried, non-photosensitive coloured layers and dried for 2 minutes at 100° C. The dry adhesive layers each have a layer weight of 7 g/m².

| Constituents | Parts by wt. |
|---|---|
| Copolymer of vinyl acetate and crotonic acid (comonomer ratio 95:5; Mowilith ® CT5, Hoechst AG) | 50.00 |
| Polyvinyl methyl ether (Lutonal ® M40, BASF) | 1.0 |
| Water | 253.3 |
| Ethanol | 24.0 |
| Ammonia solution (25%) | 5.0 |

EXAMPLE 3

Production of a Positive Colour Proof

The cyan coloured film from Example 2 is laminated at 120° C., by means of the adhesive layer, onto a plastic-coated special paper (for example Agfa Pressmatch® Dry APD01 support) as image-receiving material. After the lamination, the film support is peeled off from the coloured film. Photosensitive film No. 1 from example 1 is laminated, by means of the photosensitive layer, onto the surface of the uncovered coloured layer, likewise at 120° C. The laminate is exposed to UV light for 30 seconds through the film support of the photosensitive layer in contact under a colour separation film for cyan. The film support is then peeled off. A positive cyan image remains on the APD01 support.

EXAMPLE 4

Production of a Negative Colour Proof

Photosensitive film No. 2 from Example 1 is exposed to UV light for 100 seconds through its film support in contact under a colour separation film for cyan.

The cyan coloured film from Example 2 is laminated at 120° C., by means of the adhesive layer, onto a plastic-coated special paper (for example Agfa Pressmatch® Dry APD01 support) as image-receiving material. After lamination, the film support is peeled off from the coloured film. The photosensitive film which has been exposed in the above-described manner is laminated, by means of the photosensitive layer, onto the surface of the uncovered colour layer, likewise at 120° C. The laminate is flood-exposed to UV light for 30 seconds through the film support of the photosensitive layer. The film support is then peeled off. A negative cyan image remains on the APD01 support. The same procedure is carried out for the coloured films in the colours magenta, yellow and black.

EXAMPLE 5

Production of a Negative Colour Proof

EXAMPLE 5a;

Photosensitive film No. 3 from Example 1 is exposed to UV light for 100 seconds through its film support in contact under a colour separation film for cyan. The remainder of the procedure corresponds to Example 4. The reproduction is poorer than in Example 4.

EXAMPLE 5b;

Example 5a is repeated using photosensitive film No. 4 from Example 1. The reproduction is likewise poorer than in Example 4.

We claim:

1. Process for the production of a color image in which a photosensitive material having a temporary film support and a photosensitive layer is laminated onto a colored layer, this photosensitive layer is exposed imagewise, and this material is developed to an image by peeling-off the support film, wherein using the same photosensitive material and the same colored layer, a positive image can be produced by exposing this photosensitive layer imagewise after it has been laminated on, and a negative image can be produced by exposing the photosensitive layer imagewise before it has been laminated on and, after this exposure, laminating it onto the colored layer and subjecting it to exposure over its entire surface, and wherein the photosensitive layer consists essentially of a photoinitiator and the colored layer contains ethylenically unsaturated compounds.

2. Process for the production of a colored image, in which a photosensitive material having a temporary film support and a photosensitive layer is exposed imagewise and, after this exposure, laminated onto a non-photosensitive colored layer, exposed over its entire surface and developed to a negative image by peeling-off the film support, wherein the photosensitive layer consists essentially of a photoinitiator and the colored layer contains ethylenically unsaturated compounds.

3. Process according to claim 1, characterized in that the photosensitive material comprises an s-triazine as essential constituent.

4. Process according to claim 1, characterized in that the photosensitive material comprises a hexaarylbisimidazole as essential constituent.

5. Process according to claim 1, characterized in that the photosensitive material comprises a quinoxaline as essential constituent.

6. Process according to claim 1, characterized in that the photoinitiator comprises a combination of different photoinitiators.

7. Process according to claim 1, characterized in that the photosensitive material comprises sensitization dyes for controlling the spectral sensitivity.

8. Process according to claim 1, characterized in that the coloured layer is not photosensitive.

9. Process according to claim 1, characterized in that the coloured layer comprises, as essential constituents, coloured pigments or dyes, binders and at least one compound containing ethylenically unsaturated groups.

10. Process according to claim 2, characterized in that the photosensitive material comprises an s-triazine as essential constituent.

11. Process according to claim 2, characterized in that the photosensitive material comprises a hexaarylbisimidazole as essential constituent.

12. Process according to claim 2, characterized in that the photosensitive material comprises a quinoxaline as essential constituent.

13. Process according to claim 2, characterized in that the photoinitiator comprises a combination of different photoinitiators.

14. Process according to claim 2, characterized in that the photosensitive material comprises sensitization dyes for controlling the spectral sensitivity.

15. Process according to claim 2, characterized in that the coloured layer comprises, as essential constituents, coloured pigments or dyes, binders and at least one compound containing ethylenically unsaturated groups.

* * * * *